United States Patent
Hu et al.

(10) Patent No.: US 8,242,502 B2
(45) Date of Patent: Aug. 14, 2012

(54) TFT ARRAY SUBSTRATE HAVING CONDUCTIVE LAYERS CONTAINING MOLYBDENUM NITRIDE AND COPPER ALLOY

(75) Inventors: Hsien Tang Hu, Dali (TW); Chien Chih Hsiao, Jhonghe (TW); Chih Hung Tsai, Changhua County (TW)

(73) Assignee: Hannstar Display Corp., Taipei (TW)

( * ) Notice: Subject to any disclaimer, the term of this patent is extended or adjusted under 35 U.S.C. 154(b) by 276 days.

(21) Appl. No.: 12/581,438

(22) Filed: Oct. 19, 2009

(65) Prior Publication Data
US 2010/0230676 A1      Sep. 16, 2010

(30) Foreign Application Priority Data
Mar. 16, 2009  (TW) ................... 98108367

(51) Int. Cl.
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 29/76 | (2006.01) |
| H01L 31/112 | (2006.01) |
| H01L 29/15 | (2006.01) |
| H01L 31/062 | (2006.01) |
| H01L 31/113 | (2006.01) |

(52) U.S. Cl. ............. 257/57; 257/59; 257/66; 257/72; 257/291; 257/E29.151; 257/E29.273; 257/E29.275; 257/E29.298

(58) Field of Classification Search ............. 257/57, 257/59, 66, 72, 291, E29.151, E29.273, E29.275, 257/E29.298
See application file for complete search history.

(56) References Cited

U.S. PATENT DOCUMENTS

| 4,272,775 | A | * | 6/1981 | Compton et al. | ............. 257/435 |
| 5,334,544 | A | * | 8/1994 | Matsuoka et al. | ............. 438/158 |
| 5,366,916 | A | * | 11/1994 | Summe et al. | ............. 438/217 |
| 5,909,615 | A | * | 6/1999 | Kuo | ............. 438/157 |
| 6,204,535 | B1 | * | 3/2001 | Yamazaki et al. | ............. 257/353 |
| 6,255,706 | B1 | * | 7/2001 | Watanabe et al. | ............. 257/412 |
| 6,376,861 | B1 | * | 4/2002 | Yaegashi et al. | ............. 257/59 |
| 6,432,799 | B1 | * | 8/2002 | Hashimoto et al. | ............. 438/435 |
| 6,529,251 | B2 | * | 3/2003 | Hibino et al. | ............. 349/42 |
| 6,767,755 | B2 | * | 7/2004 | Yamanaka et al. | ............. 438/30 |
| 7,250,337 | B2 | * | 7/2007 | Lee | ............. 438/257 |
| 7,462,895 | B2 | * | 12/2008 | Park et al. | ............. 257/211 |
| 7,586,197 | B2 | * | 9/2009 | Lee et al. | ............. 257/762 |
| 7,662,676 | B2 | * | 2/2010 | Park et al. | ............. 438/149 |
| 7,687,327 | B2 | * | 3/2010 | Cleeves et al. | ............. 438/149 |
| 7,759,738 | B2 | * | 7/2010 | Kim et al. | ............. 257/350 |
| 7,795,690 | B2 | * | 9/2010 | Misaki | ............. 257/388 |
| 7,820,368 | B2 | * | 10/2010 | Park et al. | ............. 430/329 |
| 7,932,537 | B2 | * | 4/2011 | Subramanian et al. | ............. 257/121 |

(Continued)

*Primary Examiner* — Ida M Soward

(57) ABSTRACT

A TFT array substrate includes a substrate, at least one gate line and gate electrode, a gate insulating layer, and at least one channel component, source electrode, drain electrode and data line. The gate line and gate electrode are disposed on the substrate, wherein both of the gate line and gate electrode have first and second conductive layers, the first conductive layer is formed on the substrate, the first conductive layer contains molybdenum nitride, the second conductive layer is formed on the first conductive layer, and the second conductive layer contains copper. The gate insulating layer is disposed on the gate line, gate electrode and the substrate. The channel component is disposed on the gate insulating layer. The source electrode and drain electrode are disposed on the channel component, and data line is disposed on the gate insulating layer.

5 Claims, 5 Drawing Sheets

U.S. PATENT DOCUMENTS

| | | | |
|---|---|---|---|
| 7,943,519 B2* | 5/2011 | Park et al. | 438/689 |
| 2009/0085095 A1* | 4/2009 | Kamath et al. | 257/321 |
| 2009/0090942 A1* | 4/2009 | Kim et al. | 257/288 |
| 2009/0160741 A1* | 6/2009 | Inoue et al. | 345/76 |
| 2009/0173944 A1* | 7/2009 | Chen et al. | 257/66 |
| 2009/0184323 A1* | 7/2009 | Yang et al. | 257/72 |

* cited by examiner

TFT ARRAY SUBSTRATE HAVING CONDUCTIVE LAYERS CONTAINING MOLYBDENUM NITRIDE AND COPPER ALLOY

CROSS REFERENCE TO RELATED APPLICATION

This application claims the priority benefit of Taiwan Patent Application Serial Number 098108367, filed on Mar. 16, 2009, the full disclosure of which is incorporated herein by reference.

TECHNICAL FIELD

The invention is related to a method for manufacturing a TFT array substrate, and more particularly to a method for manufacturing a TFT array substrate, wherein this method can solve the problem that the adhesion between the copper conductive line and the glass substrate is not good.

BACKGROUND

As high technology is developed gradually, a video product (e.g. digital video or image device) has become a popular product in the daily live. According to the digital video or image device, a liquid crystal displaying panel is an important component so as to display the correlative information. The user can read the necessary information from this liquid crystal displaying panel.

Referring to FIGS. 1 and 2, a conventional liquid crystal displaying panel 10 includes a thin film transistor (TFT) array substrate 20, a color filter (CF) substrate 40 and a liquid crystal 12. The liquid crystal 12 is located between the TFT array substrate 20 and the CF substrate 40. The TFT array substrate 20 includes a plurality of gate electrodes 22, a gate insulating layer 24, a plurality of channel components 25, a plurality of drain electrodes 26, a plurality of source electrodes 28, a passivating layer 30 and a plurality of pixel electrodes 32, which all are formed on a glass substrate 34 in sequence, wherein each gate electrode 22, gate insulating layer 24, channel component 25, drain electrode 26 and source electrode 28 can be formed to a thin film transistor (TFT) 21. The channel component 25 includes first and second semiconductor layers 25a, 25b, wherein the first semiconductor layer 25a is an active layer, and the second semiconductor layer 25b is an ohmic contact layer containing N-type dopant. A plurality of gate lines 52 are disposed on the glass substrate 34. The gate insulating layer 24 covers the gate lines 52. A plurality of data lines 54 are disposed on the gate insulating layer 24. Two adjacent gate lines 52 and two adjacent data lines 54 define a pixel 56. The common electrode 33a is located at one side of the pixel 56. The passivating layer 30 covers the data lines 54. A plurality of pixel electrodes 32 are disposed on the passivating layer 30, and located in the pixels 56 respectively. The CF substrate 40 includes a plurality of black matrices 48, a color filter layer 42 and a transparent electrode 44, which all are formed on another glass substrate 46 in sequence.

Recently, a conductive line which is used in the liquid crystal displaying panel is mainly made of aluminum metal (Al metal) or aluminum alloy (Al alloy), because Al metal or Al alloy has low resistance value and is easily made. However, as the liquid crystal displaying panel with big size is popular gradually, the conductive line having much low resistance value must be developed quickly, i.e. maybe the conductive line will be mostly made of copper metal (Cu metal) replacing Al metal or Al alloy.

When the copper conductive line is developed, there is a problem that the adhesion between the copper conductive line and the glass substrate is not good. In order to solve this problem, an adhesive layer is added to be disposed between the copper conductive line and the glass substrate, thereby helpfully increasing the adhesion between the copper conductive line and the glass substrate. However, generally the resistance value of the adhesive layer is not low so as to increase the resistance value of the copper conductive line. Or, the adhesive layer and the copper conductive line do not have similar etching property when the adhesive layer and the copper conductive line are etched. Thus, the manufacture cost can be increased.

In addition, when the copper conductive line is developed, there is another problem that the copper (Cu) of the copper conductive line and the silicon (Si) of the semiconductor layer containing N-type dopant can be diffused to each other.

Accordingly, there exists a need for a method for manufacturing a TFT array substrate capable of solving the above-mentioned problems.

SUMMARY

The present invention provides a TFT array substrate including a substrate, at least one gate line and gate electrode, a gate insulating layer, and at least one channel component, source electrode, drain electrode and data line. The gate line and gate electrode are disposed on the substrate, wherein both of the gate line and gate electrode have first and second conductive layers, the first conductive layer is formed on the substrate, the first conductive layer contains molybdenum nitride, the second conductive layer is formed on the first conductive layer, and the second conductive layer contains copper. The gate insulating layer is disposed on the gate line, gate electrode and the substrate. The channel component is disposed on the gate insulating layer. The source electrode and drain electrode are disposed on the channel component, and data line is disposed on the gate insulating layer.

According to the gate line and the gate electrode of the present invention, the gate line and the gate electrode constituted by the copper metal layer and the molybdenum nitride layer can solve the problem that the adhesion between the copper conductive line and the glass substrate is not good. The molybdenum nitride layer can be an adhesive layer disposed between the copper conductive line and the glass substrate, thereby helpfully increasing the adhesion between the copper metal layer and the glass substrate. Furthermore, according to the gate line and the gate electrode of the present invention, the copper metal layer and the molybdenum nitride layer of the gate line and the gate electrode have low resistance value so as not to increase the resistance value of the copper conductive line. Also, the molybdenum nitride layer and the copper metal layer have similar etching property when the molybdenum nitride layer and the copper metal layer are etched. Thus, the manufacture cost can be decreased. In addition, after the copper metal layer of the gate line and the gate electrode is formed, a deoxidizer is provided for removing a copper oxide (CuO), whereby the resistance value of the gate line and gate electrode cannot be increased.

The foregoing, as well as additional objects, features and advantages of the invention will be more apparent from the following detailed description, which proceeds with reference to the accompanying drawings.

BRIEF DESCRIPTION OF THE DRAWINGS

Embodiments of the present invention are illustrated by way of example, and not by limitation, in the figures of the accompanying drawings, wherein elements having the same reference numeral designations represent like elements throughout and wherein.

DETAILED DESCRIPTION OF THE PREFERRED EMBODIMENT

Figure 1:
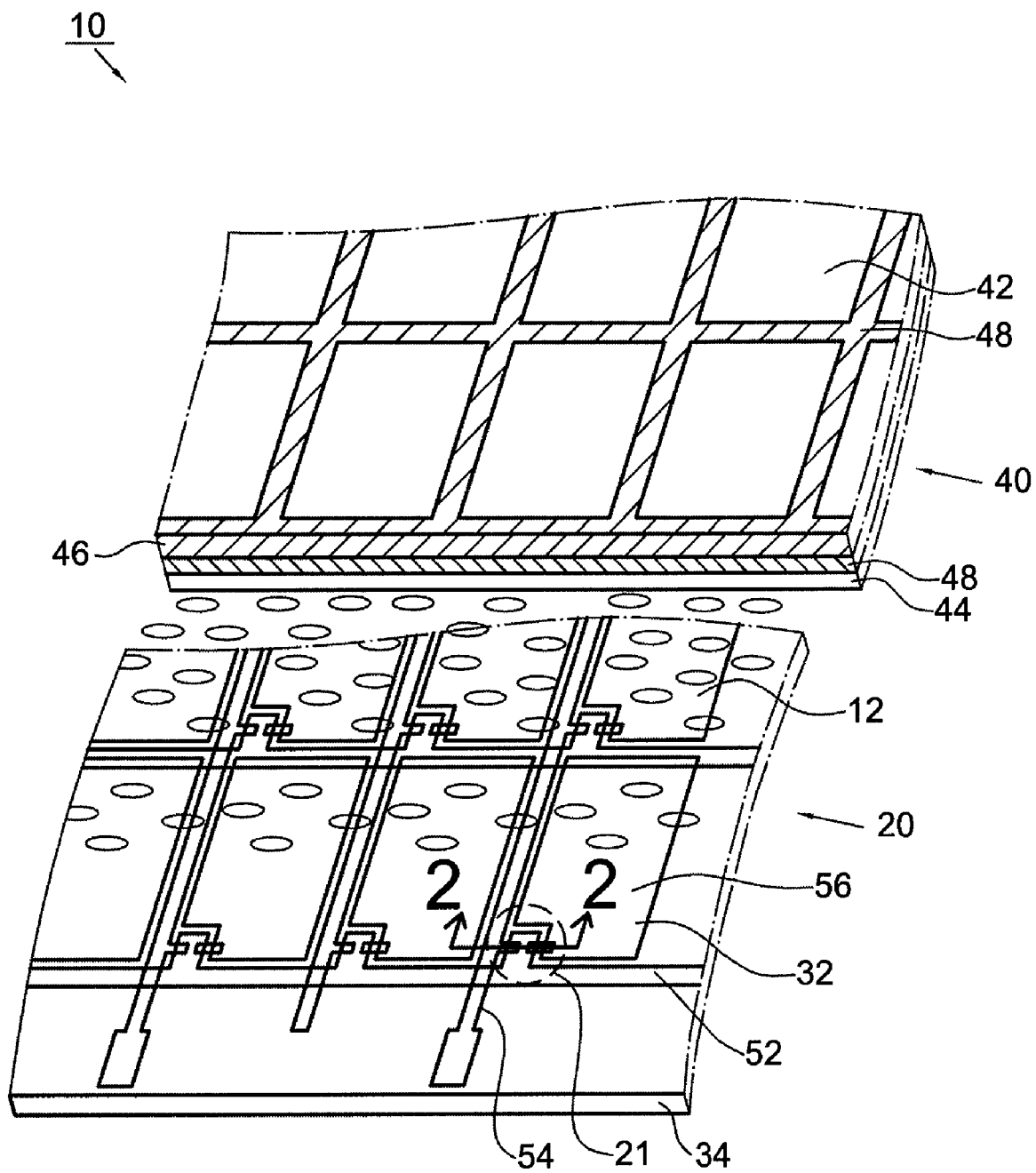
FIG. 1 is a partially perspective schematic view of a liquid crystal displaying panel in the prior art.
Figure 2:
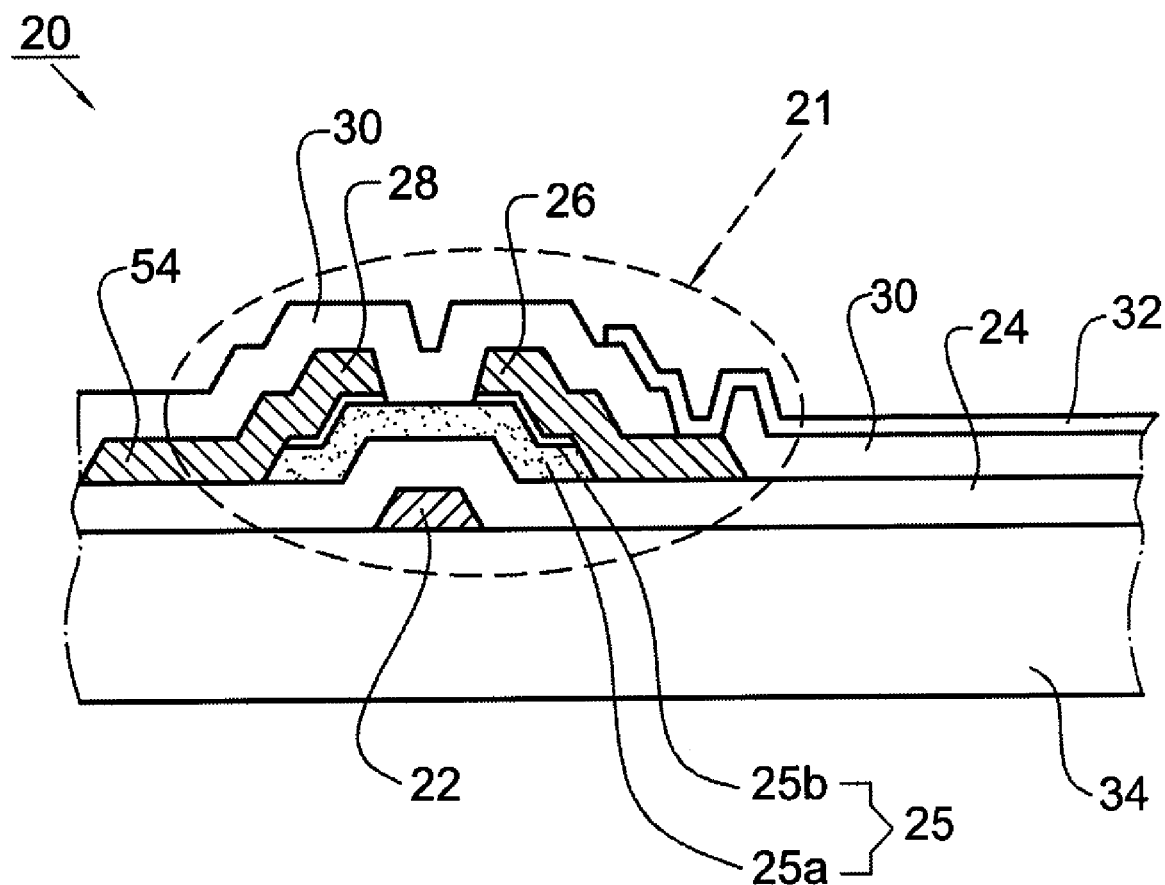
FIG. 2 is a partially cross-sectional schematic view of a TFT array substrate in the prior art.
Figure 3:
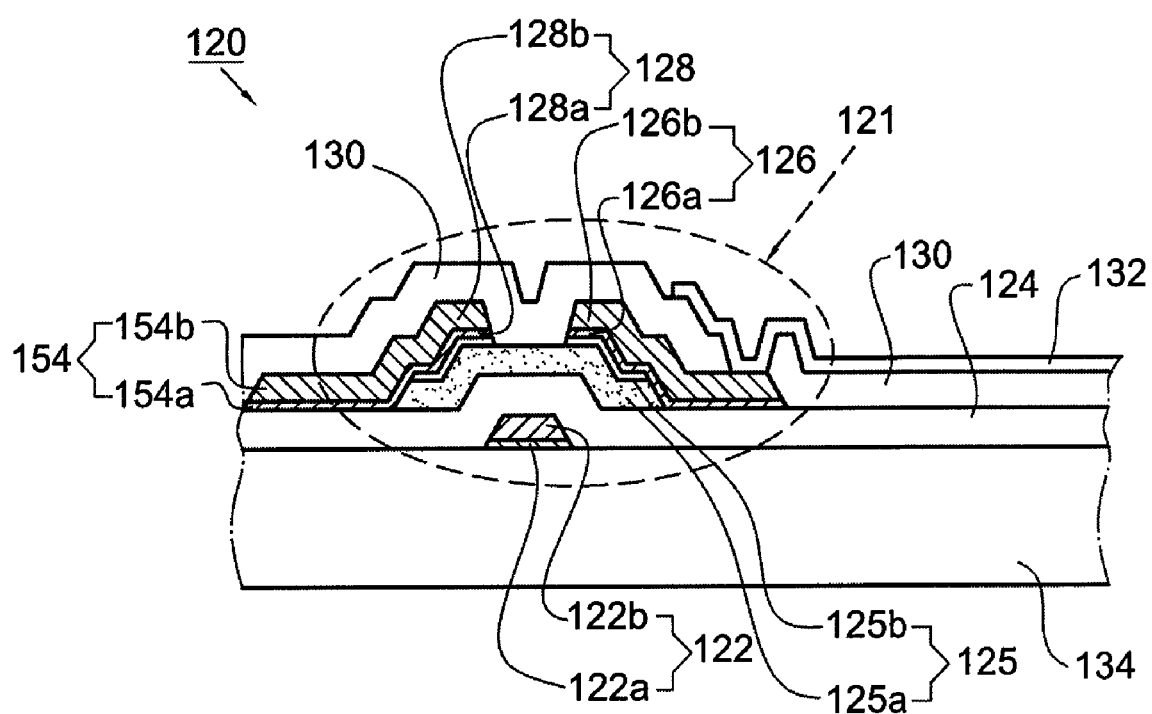
FIG. 3 is a partially cross-sectional schematic view of a TFT array substrate according to an embodiment of the present invention.

Referring to FIG. 3, it depicts a thin film transistor (TFT) array substrate 120 according to an embodiment of the present invention. The TFT array substrate 120 includes a substrate (e.g. glass substrate 134). At least one gate line (similar to numeral 152 shown in FIG. 1 in the prior art) and one gate electrodes 122 are disposed on the glass substrate 134. Both of the gate line and gate electrode 122 have first and second conductive layers 122a, 122b, the first conductive layer 122a is formed on the glass substrate 134, the first conductive layer 122a contains a molybdenum nitride (e.g. MoN), the second conductive layer 122b is formed on the first conductive layer 122a, and the second conductive layer 122b contains copper. The second conductive layer 122b can be a metal layer containing copperonly. Or, the second conductive layer 122b can be an alloy layer containing copper. The alloy layer contains copper, the copper content is more than 95% by weight, and the alloy layer further contains other metal selected from at least one of the group consisting of titanium (Ti), tantalum (Ta), chromium (Cr), nickel (Ni), neodymium (Nd), indium (In) and aluminum (Al). A gate insulating layer 124 is disposed on the glass substrate 134, and covers the gate line and the gate electrode 122. The second conductive layer 122b and the first conductive layer 122a of the gate line and the gate electrode 122 contact the gate insulating layer 124 and the glass substrate 134 respectively. A channel component 125 is disposed on the gate insulating layer 124. The channel component 125 includes first and second semiconductor layers 125a, 125b, wherein the first semiconductor layer 125a is formed on the gate insulating layer 124, the first semiconductor layer 125a can be an active layer, the second semiconductor layer 125b is formed on the first semiconductor layer 125a, and the second semiconductor layer 125b can be an ohmic contact layer containing N-type dopant. At least one drain electrode 126 and source electrode 128 are disposed on the channel component 125, and at least one data line 154 is disposed on the gate insulating layer 124. The drain electrode 126, the source electrode 128 and the data line 154 have third conductive layers 126a, 128a, 154a and fourth conductive layers 126b, 128b, 154b respectively. The third conductive layers 126a, 128a, 154a are formed on the second semiconductor layer 125b of the channel component 125 and the gate insulating layer 124. The third conductive layers 126a, 128a, 154a contains a molybdenum nitride (e.g. MoN). The fourth conductive layers 126b, 128b, 154b are formed on the third conductive layers 126a, 128a, 154a respectively, and the fourth conductive layers 126b, 128b, 154b contains copper. The fourth conductive layer 126b, 128b, 154b can be a metal layer containing copper only. Or, the fourth conductive layer 126b, 128b, 154b can be an alloy layer containing copper. The alloy layer contains copper, the copper content is more than 95% by weight, and the alloy layer further contains other metal selected from at least one of the group consisting of titanium (Ti), tantalum (Ta), chromium (Cr), nickel (Ni), neodymium (Nd), indium (In) and aluminum (Al). A passivating layer 130 is disposed on the drain electrode 126, the source electrode 128, the data line 154 and the gate insulating layer 124. The fourth conductive layers 126b, 128b and the third conductive layers 126a, 128a of the drain electrode 126 and the source electrode 128 contact the passivating layer 130 and the channel component 125 respectively. The fourth conductive layer 154b and the third conductive layer 154a of the data line 154 contact the passivating layer 130 and the gate insulating layer 124 respectively. A pixel electrode 132 is disposed on the passivating layer 130 and electrically connected to the drain electrode 126.

Figure 4:
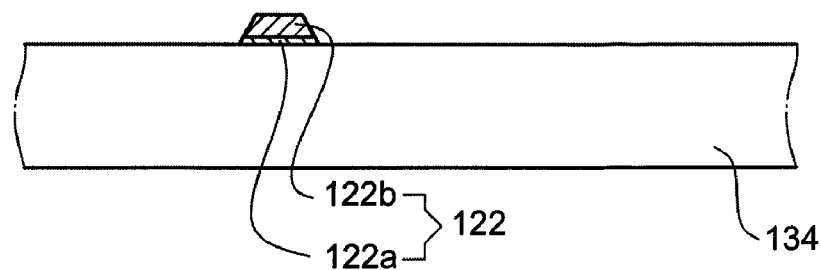
FIGS. 4-8 are partially cross-sectional schematic views showing a method for manufacturing a TFT array substrate according to an embodiment of the present invention.

Referring to FIGS. 4 to 8, they depict a method for manufacturing a TFT array substrate according to an embodiment of the present invention. Referring to FIG. 4, a substrate (e.g. glass substrate 134) is provided. At least one gate line (similar to numeral 152 shown in FIG. 1 in the prior art) and one gate electrodes 122 are formed on the glass substrate 134. The forming step of the gate line and gate electrode 122 includes the following steps. A first conductive layer 122a is formed on the glass substrate 134 by a first sputtering process, wherein the first conductive layer 122a contains a molybdenum nitride. A second conductive layer 122b is formed on the first conductive layer 122a by a second sputtering process, wherein the second conductive layer 122b contains copper. The first and second conductive layers 122a, 122b are patterned to the gate line and gate electrode 122. After the second conductive layer 122b (e.g. copper metal layer) is formed, the surface of copper metal layer can be oxidized. If a deoxidizer is provided for removing a copper oxide (CuO), the resistance value of the gate line and gate electrode 122 cannot be increased.

Figure 5:
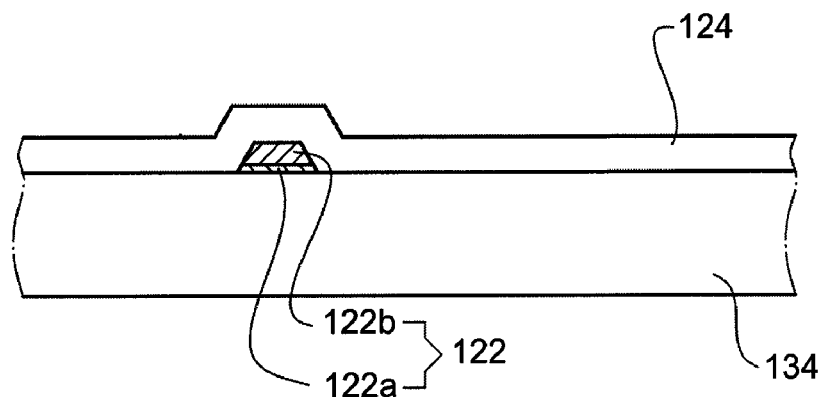
Figure 6:
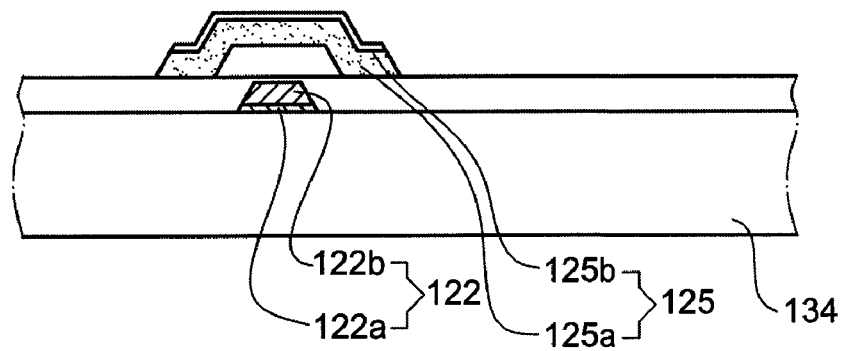

Referring to FIG. 5, a gate insulating layer 124 is formed on the gate line, gate electrode 122 and the glass substrate 134. Referring to FIG. 6, a first semiconductor layer 125a is formed on the gate insulating layer 124. A second semiconductor layer 125b is formed on the first semiconductor layer 125a, wherein the second semiconductor layer 125b contains N-type dopant. The first and second semiconductor layers 125a, 125b are patterned to at least one channel component 125.

Figure 7:
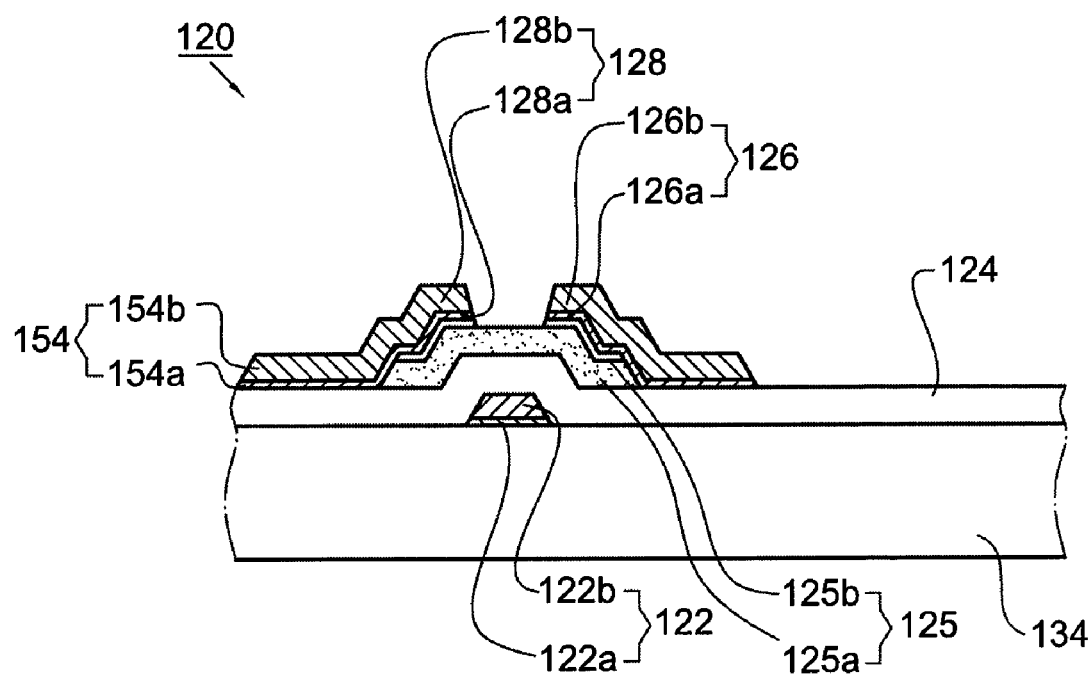

Referring to FIG. 7, at least one drain electrode 126 and source electrode 128 are formed on the channel component 125, a channel region is formed between the source electrode 128 and drain electrode 126, and at least one data line 154 is simultaneously formed on the gate insulating layer 124. The forming step of the drain electrode 126, the source electrode 128 and the data line 154 includes the following steps. Third conductive layers 126a, 128a, 154a are formed on the patterned second semiconductor layer 125b of the channel component 125 and the gate insulating layer 124 by a third sputtering process, wherein the third conductive layers 126a, 128a, 154a contains a molybdenum nitride (e.g. MoN). Fourth conductive layers 126b, 128b, 154b are formed on the third conductive layers 126a, 128a, 154a by a fourth sputtering process, wherein the fourth conductive layers 126b, 128b, 154b contains copper. The third and fourth conductive layers 122a, 122b are patterned to the drain electrode 126, the source electrode 128 and the data line 154. After the fourth conductive layers 126b, 128b, 154b (e.g. copper metal layer) are formed, the surface of copper metal layer can be oxidized. If a deoxidizer is provided for removing a copper oxide (CuO), the resistance value of the drain electrode 126, the source electrode 128 and the data line 154 cannot be increased.

Figure 8:
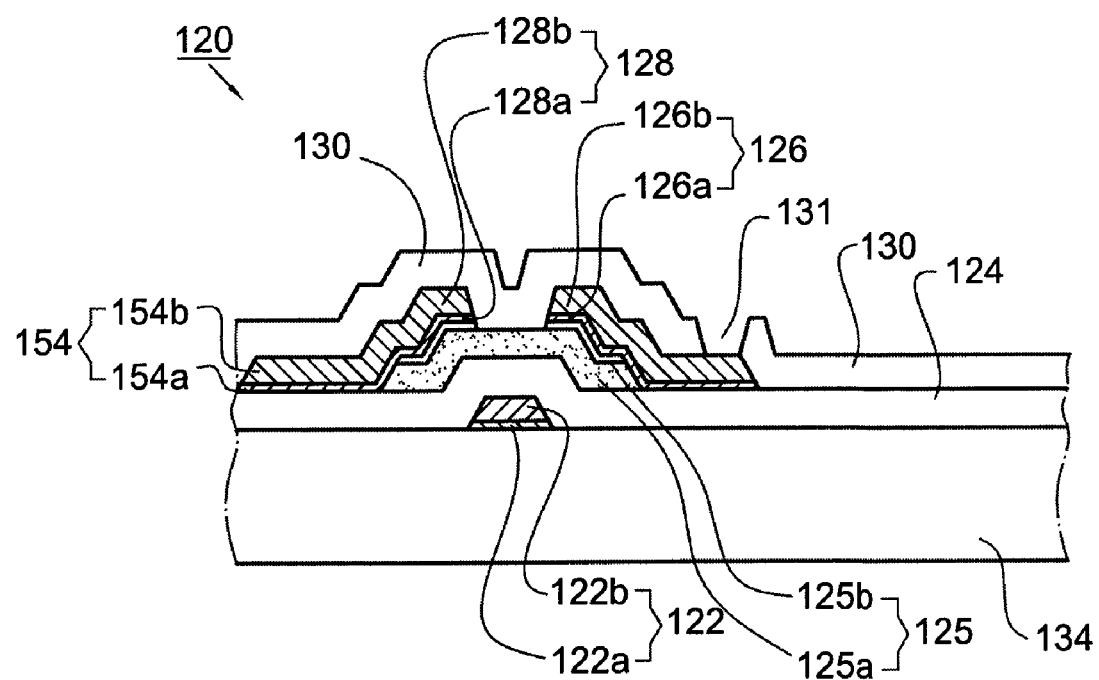

Referring to FIG. 8, a passivating layer 130 is formed on the drain electrode 126, the source electrode 128, the data line 154 and the gate insulating layer 124. Then, a through hole is formed in the passivating layer 130. Finally, a pixel electrode 132 is formed on the passivating layer 130 and electrically connected to the drain electrode 126 so as to form the TFT array substrate 120 of the present invention, shown in FIG. 3.

According to the gate line and the gate electrode of the present invention, the gate line and the gate electrode constituted by the copper metal layer and the molybdenum nitride layer can solve the problem that the adhesion between the copper conductive line and the glass substrate is not good. The molybdenum nitride layer can be an adhesive layer disposed between the copper conductive line and the glass substrate, thereby helpfully increasing the adhesion between the copper metal layer and the glass substrate. Furthermore, according to the gate line and the gate electrode of the present invention, the copper metal layer and the molybdenum nitride layer of the gate line and the gate electrode have low resistance value so as not to increase the resistance value of the copper conductive line. Also, the molybdenum nitride layer and the copper metal layer have similar etching property when the molybdenum nitride layer and the copper metal layer are etched. Thus, the manufacture cost can be decreased. In addition, after the copper metal layer of the gate line and the gate electrode is formed, a deoxidizer is provided for removing a copper oxide (CuO), whereby the resistance value of the gate line and gate electrode cannot be increased.

According to the drain electrode, the source electrode and the data line of the present invention, the drain electrode, the source electrode and the data line constituted by the copper metal layer and the molybdenum nitride layer can solve the problem that the copper of the copper conductive line and the silicon (Si) of the semiconductor layer containing N-type dopant are diffused to each other. The molybdenum nitride layer can be an adhesive layer disposed between the copper metal layer and the semiconductor layer containing N-type dopant, thereby preventing the copper and the silicon (Si) from being diffused to each other. Furthermore, according to the drain electrode, the source electrode and the data line of the present invention, the copper metal layer and the molybdenum nitride layer of the drain electrode, the source electrode and the data line have low resistance value so as not to increase the resistance value of the copper conductive line. Also, the molybdenum nitride layer and the copper metal layer have similar etching property when the molybdenum nitride layer and the copper metal layer are etched. Thus, the manufacture cost can be decreased. In addition, after the copper metal layer of the drain electrode, the source electrode and the data line is formed, a deoxidizer is provided for removing a copper oxide (CuO), whereby the resistance value of the drain electrode, the source electrode and the data line cannot be increased.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An array substrate comprising:
   a substrate;
   at least one gate line and gate electrode disposed on the substrate, wherein both of the gate line and gate electrode have first and second conductive layers, the first conductive layer is formed on the substrate, the first conductive layer contains a molybdenum nitride, the second conductive layer is formed on the first conductive layer, the second conductive layer is an alloy layer containing copper with a copper content of more than 95% by weight, and the alloy layer further contains at least one metal selected from the group consisting of titanium (Ti), tantalum (Ta), chromium (Cr), nickel (Ni), neodymium (Nd), indium (In) and aluminum (Al);
   a gate insulating layer disposed on the gate line, gate electrode and the substrate;
   at least two semiconductor layers disposed on the gate insulating layer; and
   at least one source electrode and drain electrode disposed on the semiconductor layers, and at least one data line disposed on the gate insulating layer.

2. The array substrate as claimed in claim 1, wherein a channel region is formed between the source electrode and drain electrode.

3. The array substrate as claimed in claim 1, wherein the substrate is a glass substrate.

4. The array substrate as claimed in claim 1, wherein the molybdenum nitride is MoN.

5. The array substrate as claimed in claim 1, wherein the source electrode, the drain electrode and the data line have third and fourth conductive layers, the third conductive layer is formed on the semiconductor layers and the gate insulating layer, the third conductive layer contains a molybdenum nitride, the fourth conductive layer is formed on the third conductive layer, and the fourth conductive layer contains copper.

* * * * *